United States Patent
Shimizu et al.

(10) Patent No.: US 7,314,519 B2
(45) Date of Patent: Jan. 1, 2008

(54) VAPOR-PHASE EPITAXIAL APPARATUS AND VAPOR PHASE EPITAXIAL METHOD

(75) Inventors: Eiichi Shimizu, Toda (JP); Nobuhito Makino, Toda (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 256 days.

(21) Appl. No.: 10/515,969

(22) PCT Filed: Oct. 16, 2002

(86) PCT No.: PCT/JP02/10714

§ 371 (c)(1),
(2), (4) Date: Nov. 29, 2004

(87) PCT Pub. No.: WO03/107404

PCT Pub. Date: Dec. 24, 2003

(65) Prior Publication Data

US 2005/0166836 A1 Aug. 4, 2005

(30) Foreign Application Priority Data

Jun. 13, 2002 (JP) .............................. 2002-172407
Aug. 19, 2002 (JP) .............................. 2002-238207

(51) Int. Cl.
  C30B 23/00 (2006.01)
  C30B 15/30 (2006.01)
  C30B 11/00 (2006.01)
  B05C 13/00 (2006.01)
(52) U.S. Cl. .................. 117/84; 117/201; 117/202; 117/203; 117/204; 118/500; 118/715; 118/725
(58) Field of Classification Search .............. 117/84, 117/201–204; 118/500, 715, 725
See application file for complete search history.

(56) References Cited

U.S. PATENT DOCUMENTS 5,304,247 A * 4/1994 Kondo et al. ................ 118/715
5,434,100 A * 7/1995 Nakamura et al. .......... 117/101
5,556,500 A * 9/1996 Hasegawa et al. ...... 156/345.27

(Continued)

FOREIGN PATENT DOCUMENTS

DE  44 04 110 A1  10/1994

(Continued)

Primary Examiner—Robert Kunemund
Assistant Examiner—G. Nagesh Rao
(74) Attorney, Agent, or Firm—Birch, Stewart, Kolasch & Birch, LLP

(57) ABSTRACT

A vapor-phase growth apparatus including a reaction furnace, a wafer container disposed in said furnace, a gas supply member, and a heating member, wherein the apparatus is designed to form a grown film on a front surface of the wafer by supplying a source gas in a high temperature state while the heating member heats the wafer in the reaction furnace through the wafer container. The wafer container includes a heat flow control section having a space for disposing a wafer; and a heat flow transmitting section joined to the heat flow control section. The contact heat resistance $R_g$ between the heat flow control section and the heat flow transmitting section is not less than $1.0 \times 10^{-6}$ $m^2K/W$ to not more than $5.0 \times 10^{-3}$ $m^2K/W$. The heat flow control section is made of a material having a coefficient of thermal conductivity 5 to 20 times that of the wafer.

16 Claims, 5 Drawing Sheets

U.S. PATENT DOCUMENTS

| | | | |
|---|---|---|---|
| 5,584,936 A | 12/1996 | Pickering et al. | |
| 5,782,979 A * | 7/1998 | Kaneno et al. | 118/500 |
| 5,958,265 A * | 9/1999 | Ogahara | 219/121.43 |
| 6,024,852 A * | 2/2000 | Tamura et al. | 204/298.12 |
| 6,878,250 B1 * | 4/2005 | Segal et al. | 204/298.13 |
| 6,900,149 B1 * | 5/2005 | Ito et al. | 501/98.4 |
| 7,101,447 B2 * | 9/2006 | Turner | 148/518 |
| 2001/0052324 A1 | 12/2001 | Rupp et al. | |

FOREIGN PATENT DOCUMENTS

| | | |
|---|---|---|
| EP | 0 519 608 A1 | 12/1992 |
| GB | 2 277 748 A | 11/1994 |
| JP | 55-10436 A | 1/1980 |
| JP | 61-219130 A | 9/1986 |
| JP | 2-82528 A | 3/1990 |
| JP | 3-69113 A | 3/1991 |
| JP | 7-245292 A | 9/1995 |
| JP | 10-107018 A | 4/1998 |
| JP | 10-303288 A | 11/1998 |
| JP | 11-180796 A | 7/1999 |
| JP | 2000-355766 A | 12/2000 |
| JP | 2001-230234 A | 8/2001 |
| JP | 2002-145670 A | 5/2002 |
| WO | WO-92/05577 A1 | 4/1992 |

* cited by examiner

FIG.1
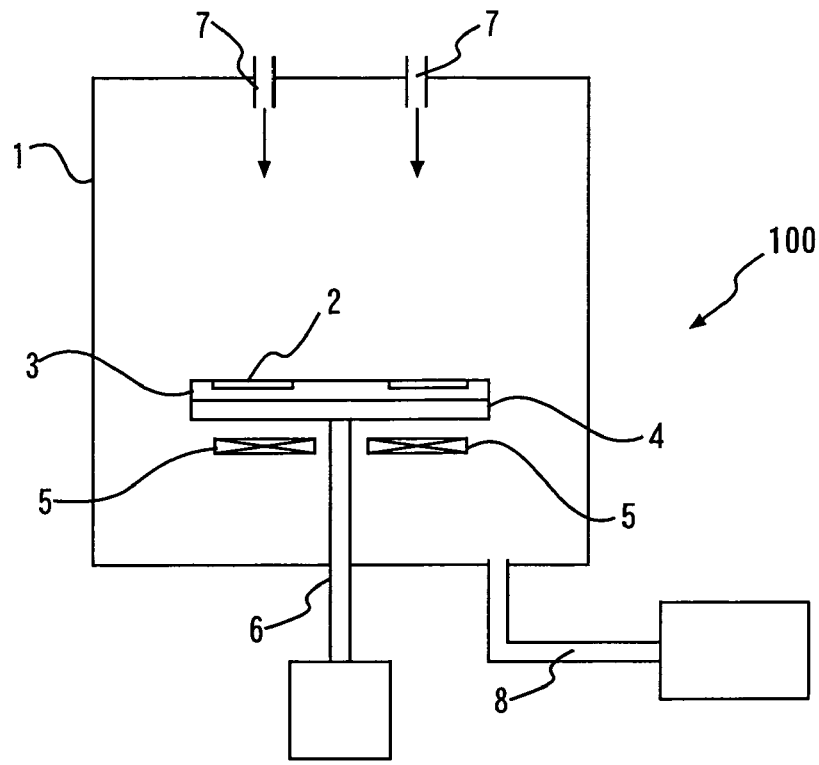
(a)
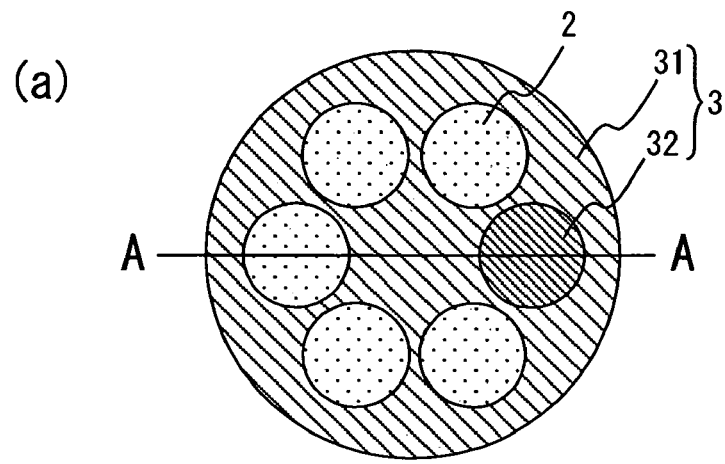
(b)
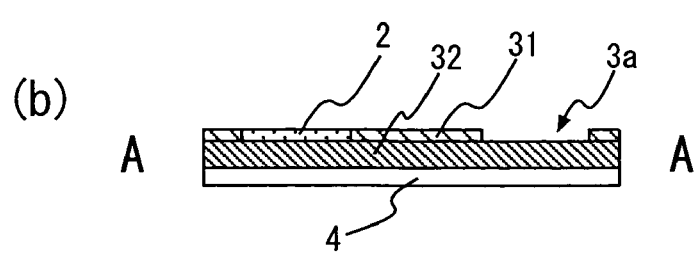
FIG.2

RANGE : 634°C-638°C/40DIV
RESOLUTION : 0.1°C/DIV

RANGE : 636°C-640°C/40DIV
RESOLUTION : 0.1°C/DIV

VAPOR-PHASE EPITAXIAL APPARATUS AND VAPOR PHASE EPITAXIAL METHOD

TECHNICAL FIELD

The present invention relates to a vapor-phase growth apparatus and a vapor-phase growth method, for growing a thin film of compound semiconductor or the like on a surface of a wafer in a vapor phase, while heating the wafer under a supply of a source gas in a high temperature state, and in particular to material characteristics of a wafer container for disposing wafers thereon.

BACKGROUND ART

Vapor-phase growth process is currently utilized in various industrial fields. Needless to say, in the vapor-phase growth, advanced uniformities in thickness, composition and doping concentration of a film grown on the wafer over the entire surface thereof are essential matters. Achievement of thermal uniformity in wafer heating is therefore recognized as the most important elementary technology as one means for realizing the aforementioned uniformities over the entire surface.

FIG. 1 is a sectional view showing an exemplary constitution of a general vapor-phase growth apparatus. As shown in FIG. 1, a vapor-phase growth apparatus 100 comprises a reaction furnace 1, a wafer holder 3 for disposing wafers 2 thereon, a susceptor 4 for placing the wafer holder 3 thereon, a heater 5 disposed below the susceptor 4, a rotary mechanism 6 for supporting the wafer holder 3 and the susceptor 4 to allow them to rotate freely, a gas introducing duct 7 for supplying a source gas and a carrier gas therethrough, a gas exhaust duct 8 for discharging the non-reacted gas, and the like.

FIG. 9 is an enlarged view for showing a detailed construction of the wafer holder 3, where (a) is a plan view, and (b) is a sectional view taken along the line A-A in FIG. 9. In one surface of the wafer holder 3, a plurality of (six in FIG. 2) circular pocket holes 3a are formed for disposing the wafers 2 therein, to be arranged along a single circumference on the surface. The other surface of the wafer holder 3 is in contact with the susceptor 4. The wafer holder 3 may be composed of one or more members. Generally, it is composed of a single member, as shown in FIG. 9.

The susceptor 4 herein is made of a material having a large coefficient of thermal conductivity (e.g., molybdenum) in order to uniformly transfer heat from the heater 5. It is also general to use graphite, molybdenum or the like, having a large coefficient of thermal conductivity for the wafer holder 3.

In the vapor-phase growth apparatus having such a structure described above, heat is transferred to the wafer 2 through the susceptor 4 and wafer holder 3 by heating the susceptor 4 from the lower side thereof by using the heater 5, to thereby heat the wafer 2 up to a predetermined temperature. Vapor-phase growth of a thin film is carried out by rotating the susceptor 4 at a predetermined number of rotation with the aid of a rotating mechanism 6 while uniformly supplying source gas and carrier gas, introduced through a gas introducing duct 7 toward the front surface of the wafer 2.

It was, however, found from an experiment of the present inventors that, in the aforementioned vapor-phase growth apparatus 100, the front surface temperature of the wafer 2 became lower than that of the wafer holder 3, and that the temperature of the circumferential portion of the wafer 2 consequently became higher than that of the central portion of the wafer 2, by the effect of the temperature of the wafer holder 3. In other words, it was found to be difficult for the conventional vapor-phase growth apparatus 100 to form a thin film with a high uniformity over the entire surface of the wafer 2 by vapor-phase growth since in-plane temperature distribution of the wafer 2 could not be uniform.

The present invention has been developed in order to solve the aforementioned problems. An object of the invention is therefore to provide a vapor-phase growth apparatus and a vapor-phase growth method which are capable of allowing a thin film to grow in a vapor phase so as to achieve a desirable uniformity over the entire surface of a wafer.

DISCLOSURE OF THE INVENTION

In accordance with the invention, the vapor-phase growth apparatus comprises: at least a reaction furnace which can be tightly closed, a wafer container which is disposed in the reaction furnace, for disposing a wafer at a predetermined position thereon, a gas supply member for supplying a source gas toward the wafer, and a heating member for heating the wafer; the apparatus being designed to form a grown film on a front surface of the wafer by heating the wafer in the reaction furnace through the wafer container while supplying the source gas in a high temperature state, wherein the wafer container comprises: a heat flow control section having a space formed, for disposing a wafer therein; and a heat flow transmitting section which is joined to the heat flow control section, for transmitting heat to the wafer disposed in the space, and a uniform heat resistance $R_g$ exists between flat or curved surfaces, of the heat flow control section and the heat flow transmitting section, in close proximity to each other.

According to the wafer container having such a structure, it is possible to adjust the ratio $R_2/R_1$ easily, where $R_1$ is a heat resistance in a heat transfer route from a rear surface of the heat flow transmitting section to the front surface of the wafer, and $R_2$ is a heat resistance in a heat transfer route from the rear surface of the heat flow transmitting section to a front surface of the heat flow control section.

Preferably, the heat resistance ratio $R_2/R_1$ is not less than 0.8 and not more than 1.2.

This almost equalizes the heat resistances in the individual heat transfer routes each other and thus ensures similar heat transfer during heat transfer from the rear surface of the wafer container (the rear surface of the heat flow transmitting section) toward the front surfaces of the wafer and of the wafer container (the front surface of the heat flow control section), and this consequently equalizes achievable temperatures of the surfaces of the wafer and the wafer container. This successfully prevents the surface temperature at the circumferential portion of the wafer from rising higher than the surface temperature at the center of the wafer, which is caused by temperature difference between the surfaces of the wafer and the wafer container. Thus, it becomes possible to keep a uniform in-plane temperature distribution of the wafer. As a consequence, a thin film having a desirable uniformity can grow in the vapor phase over the entire surface of the wafer.

The heat resistance $R_g$ is not less than $1.0 \times 10^{-6}$ m²K/W and not more than $5.0 \times 10^{-3}$ m²K/W; otherwise a clearance distance between the heat flow control section and the heat flow transmitting section may be approximately uniform and in a range of 0.001 mm to 1 mm. Accordingly, because the heat resistance $R_g$ comes to be approximately equal to the contact heat resistance between the heat flow transmitting section and the wafer, it is possible to adjust the ratio $R_2/R_1$ easily.

Further, preferably, the heat flow control section is made of a material having a coefficient of thermal conductivity which is not less than 0.5 times that of the wafer disposed on the heat flow transmitting section and not more than 20 times thereof. Although it is not limited, the heat flow control section 31 may be made of any material, as far as the material has characteristics giving no adverse effect on thin film growth or on the environment of the reactor.

Preferably, the heat flow transmitting section is made of a material having a coefficient of thermal conductivity higher than that of wafer, for example, a material having a coefficient of thermal conductivity which is not less than 50 W/mK and not more than 450 W/mK.

For example, the heat flow control section may be made of any one of amorphous carbon, aluminum nitride, graphite, silicon, silicon carbide, molybdenum, pyrolitec boron nitride, and alumina; and the heat flow transmitting section may be made of any one of molybdenum, graphite, gold, and silver.

A vapor-phase growth apparatus comprising the above described structure is made to form a grown film on a front surface of the wafer by heating the wafer in the reaction furnace through the wafer container while supplying the source gas in a high temperature state, wherein, a temperature difference between a front surface of the wafer container and a front surface of the wafer during growing a thin film in vapor-phase is within 2° C. Accordingly, because it is possible to keep a uniform in-plane temperature distribution of the wafer, a thin film having a desirable uniformity can be grown in the vapor phase over the entire surface of the wafer.

Next, the progress that the present invention has been developed will be described, as follows.

As for a reason why the surface temperature of the wafer 2 tends to become lower than that of the wafer holder 3, the present inventors placed a focus on the difference between heat transfer routes inside the wafer 2 and wafer holder 3. That is, the present inventors considered that because the wafer 2 and wafer holder 3 generally differ from each other in materials, so that the same heat transfer cannot be performed in the routes. This causes a difference between achievable surface temperatures of the wafer and the wafer holder.

FIG. 10 is a schematic view showing heat resistances in the wafer 2 and wafer holder 3. In FIG. 10, $T_{up}$ denotes rear surface temperature of the wafer holder 3, $T_{surf}$ denotes a front surface temperature of the wafer 2 or wafer holder 3, and $T_{down}$ denotes a temperature at an imaginary plane (referred to as "virtual boundary plane", hereinafter) set at a position being away from the surfaces of the wafer 2 and wafer holder 3 by a predetermined distance. As shown in FIG. 10, heat transfer toward the front surface of the wafer 2 is established along a heat transfer route 1 which originates from the rear surface of the wafer holder 3 and is directed through the wafer holder 3 itself and the wafer 2 to reach the virtual boundary plane, and heat transfer toward the front surface of the wafer holder 3 is established along a heat transfer route 2 which originates from the rear surface of the wafer holder 3 and is directed through the wafer holder 3 itself to reach the virtual boundary plane. As described above, the wafer 2 and wafer holder 3 differ from each other in the heat transfer route toward the respective surfaces thereof.

That is, as known from the schematic view of heat resistance of the wafer 2 and wafer holder 3 shown in FIG. 10, the heat resistance $R_1$ for the heat transfer route 1 is equal to the sum of heat resistance $R_{1c}$ for the portion of wafer holder 3, the contact heat resistance $R_{1g}$ between the wafer holder 3 and wafer 2, and the heat resistance $R_{1w}$ for the portion of wafer 2; and the heat resistance $R_2$ for the heat transfer route 2 is equal to the heat resistance $R_{2c}$ for the portion of wafer holder 3.

By the way, heat resistance R is given by the equation (1) below:

$$R = L/k \qquad (1)$$

$R[m^2K/W]$: a heat resistance $L[m]$: a thickness of a material in the direction of heat flow $k[W/m\cdot K]$: a coefficient of thermal conductivity Heat resistances $R_1$ and $R_2$ are then expressed by the equations below:

$$R_1 = R_{1c} + R_{1g} + R_{1w} = L_c/k_{1c} + R_{1g} + L_w/k_{1w} \qquad (2)$$

$$R_2 = R_{2c} = L_c/k_{2c} + L_w/k_{2c} \qquad (3)$$

$(k_{1c} = k_{2c})$

It is to be noted now that a relation can be written as $L_w/k_{1w} > L_w/k_{2c}$ because coefficient of thermal conductivity $k_{1w}$ of the wafer 2 (InP, GaAs, etc.) is extremely smaller than coefficient of thermal conductivity $k_{2c}$ of the wafer holder 3 (graphite, molybdenum, etc.), and contact heat resistance $R_{1g}$ arises at the contact plane between the wafer 2 and wafer holder 3, so that $R_2$ is apparently smaller than $R_1$.

$$R_1 > R_2 \qquad (4)$$

It is also known that heat transfer is subject to heat flux in the heat transfer route. The heat flux generally refers to as the amount of energy (heat flow) flowing in a unit area (unit: $m^2$), and is given by equation (5) below:

$$q = -1/R_{total}(T_{down} - T_{up}) \qquad (5)$$

$q[W/m^2]$: a heat flux $R_{total}[m^2K/W]$: an overall heat transfer $T_{up}[K]$: an upstream temperature $T_{down}[K]$: a downstream temperature.

In FIG. 10, overall heat resistances $R_{1total}$ and $R_{2total}$ in the heat transfer routes 1 and 2 are given by the equations below:

$$R_{1total} = R_1 + R_{1a} \qquad (6)$$

$$R_{2total} = R_2 + R_{2a} \qquad (7)$$

(where, $R_{1a} = R_{2a}$)

The foregoing equations (4), (6) and (7) give a relation of $R_{1total} > R_{2total}$. Therefore, the heat flux $q_1$ in the heat transfer route 1 becomes smaller than the heat flux $q_2$ in the heat transfer route 2.

$$q_2 > q_1 \qquad (8)$$

Furthermore, the heat fluxes $q_1$ and $q_2$ can be represented as the equations below using the surface temperature $T_{1surf}$ of the wafer 2 and the surface temperature $T_{2surf}$ of the wafer holder 3:

$$q_1 = -(T_{down} - T_{1surf})/R_{1a} \qquad (9)$$

$$q_2 = -(T_{down} - T_{2surf})/R_{2a} \qquad (10)$$

It is derived from the foregoing equations (8), (9) and (10) that the surface temperature $T_{1surf}$ of the wafer 2 is lower than the surface temperature $T_{2surf}$ of the wafer holder 3.

$$T_{2surf} > T_{1surf} \qquad (11)$$

It was thus found that, in the conventional vapor-phase growth apparatus, the difference between the surface temperatures $T_{1surf}$ and $T_{2surf}$ is caused by a large difference in the coefficients of thermal conductivity between the wafer 2 and wafer holder 3.

The present inventors therefore studied a method of reducing the difference between the surface temperature $T_{1surf}$ of the wafer 2 and the surface temperature $T_{2surf}$ of the wafer holder 3, and based on the above equations (5) to (10), and reached an idea that close equalization of the heat resistances $R_1$ and $R_2$ in the individual heat transfer routes would be successful (that is, to set heat resistance ratio $R_2/R_1$ close to 1)

The present inventors has found a method in which the wafer holder 3 is composed of two members, i.e., a heat flow control section 31 and a heat flow transmitting section 32.

In the case, the schematic view of heat resistance is shown in FIG. 3, and a heat resistance $R_1$ and a heat resistance $R_2$ are given by the equations below:

$$R_1 = R_{1c} + R_{1g} + R_{1w} = L_c/k_{1c} + R_{1g} + L_w/k_{1w} \quad (12)$$

(equivalent to the equation (2))

$$R_2 = R_{2c} + R_{2g} + R_{2w} = L_c/k_{2c} + R_{2g} + L_w/k_{2p} \quad (13)$$

($k_{1c} = k_{2c}$)

That is, it is possible to bring near the heat resistance values $R_1$ and $R_2$ to each other, by bringing the value of contact heat resistance $R_{1g}$ between the wafer 2 and the heat flow transmitting section 32 near the value of contact heat resistance $R_{2g}$ between the heat flow control section 31 and the heat flow transmitting section 32 and also by bringing the value of coefficient of thermal conductivity $k_{1w}$ of the wafer 2 near the value of coefficient of thermal conductivity $k_{2p}$ of the heat flow control section 31.

The present invention has been developed based on the aforementioned findings, and is to provide a vapor-phase growth apparatus 100 in which the wafer holder 3 includes: a heat flow control section having a space formed, for disposing a wafer 2 therein; and a heat flow transmitting section which is joined to the heat flow control section, for transmitting heat to the wafer disposed in the space, and a uniform heat resistance $R_{2g}$ exists between flat or curved surfaces, of the heat flow control section and the heat flow transmitting section, in close proximity to each other, so that the ratio $R_2/R_1$ is not less than 0.8 and not more than 1.2.

In the present invention, the heat resistance $R_g$ may be not less than $1.0 \times 10^{-6}$ m²K/W and not more than $5.0 \times 10^{-3}$ m²K/W; otherwise a clearance distance between the heat flow control section and the heat flow transmitting section may be approximately uniform and in a range of 0.001 mm to 1 mm. Accordingly, it is possible to obtain approximately equal contact heat resistances $R_{1g}$ and $R_{2g}$. Further, the heat flow control section may be made of a material having a coefficient of thermal conductivity which is not less than 0.5 times that of the wafer disposed on the heat flow transmitting section and not more than 20 times thereof, to bring the value of coefficient of thermal conductivity $k_{1w}$ of the wafer 2 near the value of coefficient of thermal conductivity $k_{2p}$ of the heat flow control section 31.

Although the heat resistance ratio $R_2/R_1$ can be approximated to 1 also by raising a value of $L_w$ or $L_c$ in the equations (12) and (13), this is less feasible due to problems in temperature control, in space efficiency of the apparatus and in costs, so that a material of the heat flow control section 31 was selected such as one having a coefficient of thermal conductivity close to that of the wafer 2, as a more practical strategy.

BRIEF DESCRIPTION OF THE DRAWINGS

FIG. 1 is a sectional view showing a schematic construction of the vapor-phase apparatus according to the present embodiment;

FIG. 2 is an enlarged views showing a detailed construction of the wafer holder 3 which is composed of a heat flow control section and a heat flow transmitting section, where (a) is a plan view, and (b) is a sectional view taken along the line A-A;

BEST MODE FOR CARRYING OUT THE INVENTION

Figure 3:
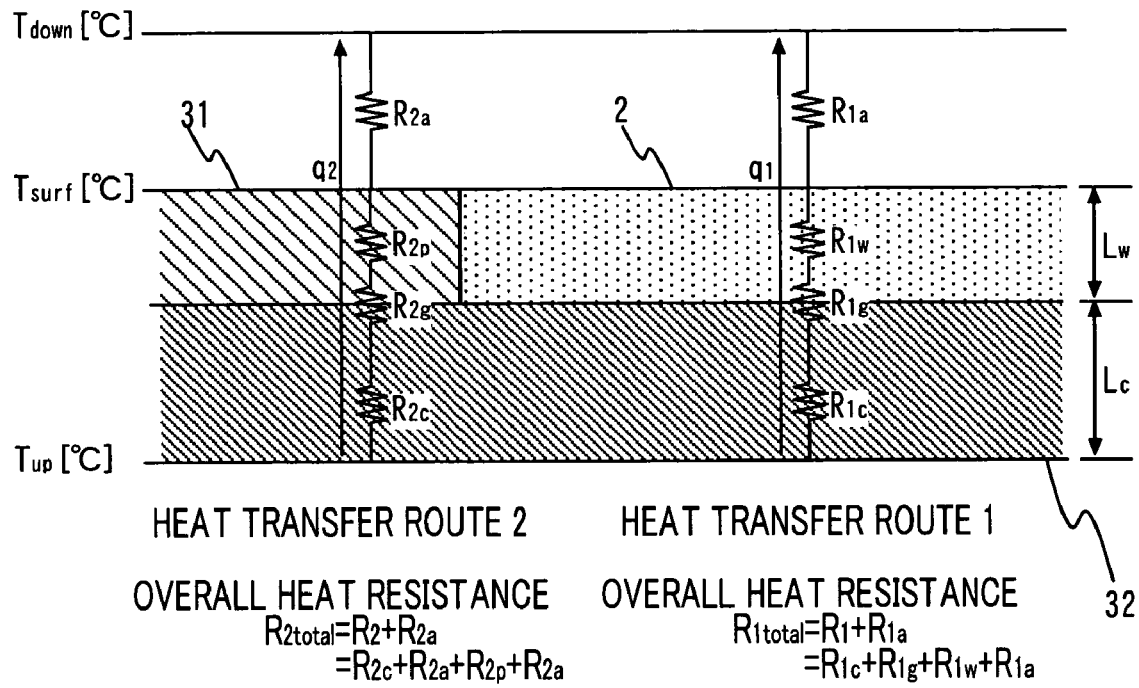
FIG. 3 is a schematic view for explaining heat resistance of the wafer 2 and wafer holder 3 in the case where the wafer holder 3 is composed of a heat flow control section and a heat flow transmitting section.

An embodiment of the vapor-phase growth apparatus (MOCVD apparatus) of the present invention will be described below referring to the attached drawings.

FIG. 1 is a sectional view showing a schematic construction of the vapor-phase growth apparatus according to the present embodiment. FIG. 2 is an enlarged view showing a detailed construction of the wafer holder 3 in the present invention, where (a) is a plan view, and (b) is a sectional view taken along the line A-A.

In the earlier development, the wafer holder 3 which is a wafer container was made of a material having a large coefficient of thermal conductivity, such as graphite. The vapor-phase growth apparatus of the embodiment is different from the earlier development in that the wafer container comprises: a heat flow transmitting section 32 made of a material having a large coefficient of thermal conductivity, such as graphite; and a heat flow control section 31 made of amorphous carbon (abbreviated as α-carbon, hereinafter) or the like, having a coefficient of thermal conductivity relatively near that of the wafer.

As shown in FIG. 1, the vapor-phase growth apparatus 100 comprises a reaction furnace 1, a wafer holder 3 for disposing wafers 2 thereon, a susceptor 4 for placing the wafer holder 3 thereon, a heater 5 disposed below the susceptor 4, a rotary mechanism 6 for supporting the wafer holder 3 and the susceptor 4 in a freely rotatable manner, a gas introducing duct 7 for supplying a source gas and a carrier gas therethrough, and a gas exhaust duct 8 for discharging the non-reacted gas.

Each of wall members of the vapor-phase growth apparatus 100 is typically composed of a stainless steel. The gas introducing duct 7 is disposed at the vicinity of the center portion of the upper wall member, and introduces a Group XIII (IIIB) source gas such as trimethyl indium (TMI), trimethyl aluminum (TMAl) or trimethyl gallium (TMG); a Group XV (VB) source gas such as arsine ($AsH_3$) or phosphine ($PH_3$); and an inert gas such as hydrogen ($H_2$) as a carrier gas into the reaction furnace.

The wafer holder 3 is composed of a member which comprises a heat flow transmitting section 32 made of graphite and formed in a disk shape, and a heat flow control section 31 made of amorphous carbon which is formed on the heat flow transmitting section 32 as a body. The wafer holder 3 is placed on the susceptor 4. In the heat flow control section 31, a plurality of (six in FIG. 2) circular pocket holes (recesses) 3a for containing the wafers 2 therein, are formed along a single circumference. The susceptor 4 is composed of a material having a large coefficient of thermal conductivity (e.g. molybdenum) in order to uniformly transfer heat from the heater 5, and is supported by the rotary mechanism 6 in a freely rotatable manner. Below the susceptor 4, the heater 5 for heating the wafer 2 is concentrically arranged.

Although it was a general practice to use graphite or molybdenum having a large coefficient of thermal conductivity, for the wafer holder 3 in the earlier developed vapor-phase growth apparatus, the wafer holder 3 in the vapor-phase growth apparatus 100 according to the present embodiment comprises a heat flow transmitting section 32 made of graphite, and a heat flow control section 31 made of α-carbon.

Concretely, by using α-carbon having a coefficient of thermal conductivity of about 10 W/m·K for the heat flow control section 31, the coefficient of thermal conductivity of the wafer 2 placed on the wafer holder 3 and the coefficient of thermal conductivity of the wafer holder 3 come to be approximately equal to each other. Because the coefficient of thermal conductivity of an InP wafer is 14.3 W/m·K which is estimated as approximately 0.7 times that of α-carbon.

The clearance between the heat flow control section 31 and the heat flow transmitting section 32 is approximately uniform in a range of 0.01 mm to 1 mm, and the contact heat resistance thereof is not less than $1.0 \times 10^{-6}$ $m^2K/W$ and not more than $1.0 \times 10^{-1}$ $m^2K/W$.

Such a construction almost equalizes the heat resistances for the individual heat transfer routes from the heater 5 to the front surface of the wafer 2 and to the front surface of the wafer holder 3, through the susceptor 4 and wafer holder 3, and this consequently equalizes achievable temperatures of the surfaces of the wafer 2 and of the wafer container 3. This successfully prevents the surface temperature at the circumferential portion of the wafer from rising higher than the surface temperature at the center of the wafer, which is caused by temperature difference between the surfaces of the wafer 2 and the wafer container 3. Thus, it becomes possible to keep a uniform in-plane temperature distribution of the wafer 2.

The heat flow transmitting section 32 may be made of not only graphite but also, for example, molybdenum, gold, silver or the like. The heat flow control section 31 may be made of not only α-carbon but also aluminum nitride, graphite, silicon, silicon carbide, molybdenum, pyrolitec boron nitride, alumina or the like.

The gas exhaust duct 8 is disposed at the bottom of the reaction furnace 1. A source gas introduced into the reaction furnace 1 from an introduction port through the gas introducing duct 7 is decomposed in the upstream side of the reaction furnace, and is then flown to the downstream side to form a thin film on the wafers 2. The non-reacted source gas is discharged out through an exhaust port and the gas exhaust duct 8, together with the carrier gas.

Although not shown in the drawings, water-cooled jackets are provided typically on the outer periphery of the rotary mechanism 6 and on the lower outside wall of the reaction furnace. These water-cooled jackets and heater 5 control the temperature inside the reaction furnace 1.

In the vapor-phase growth apparatus 100 having the above-described construction, heat is transferred to the wafer 2 through the susceptor 4 and the wafer holder 3 under heating of the susceptor 4 from the lower side thereof by using heater 5, to thereby heat the wafer 2 to a predetermined temperature. Vapor-phase growth of a thin film is carried out by rotating the susceptor 4 at a predetermined number of rotation with the aid of a rotating mechanism 6 while uniformly supplying a source gas and carrier gas introduced through a gas introducing duct 7 to the upper surface of the wafers 2. Since temperatures of the upper surface of the wafer 2 and the upper surface of the wafer holder 3 (heat flow control section 31) herein become almost equivalent each other, the in-plane temperature distribution of the wafer 2 becomes uniform, and this allows vapor-phase growth of a thin film having an excellent uniformity.

Next paragraphs will describe simulation results of heat transfer examined using the vapor-phase growth apparatus of the embodiment, in order to clarify specific features of the present invention. Also a similar simulation of heat transfer using the earlier developed vapor-phase growth apparatus was carried out as a comparative embodiment.

In the simulation, the wafer 2 and the vicinity thereof in the vapor-phase growth apparatus 100 were modeled, and three-dimensional heat transfer analysis based on the finite volume method was carried out. A wafer holder 3 which includes a heat flow transmitting section 32 made of graphite and a heat flow control section 31 made of α-carbon, was used in the embodiment, and a graphite-made wafer holder 3 was used in a comparative embodiment.

Figure 4:
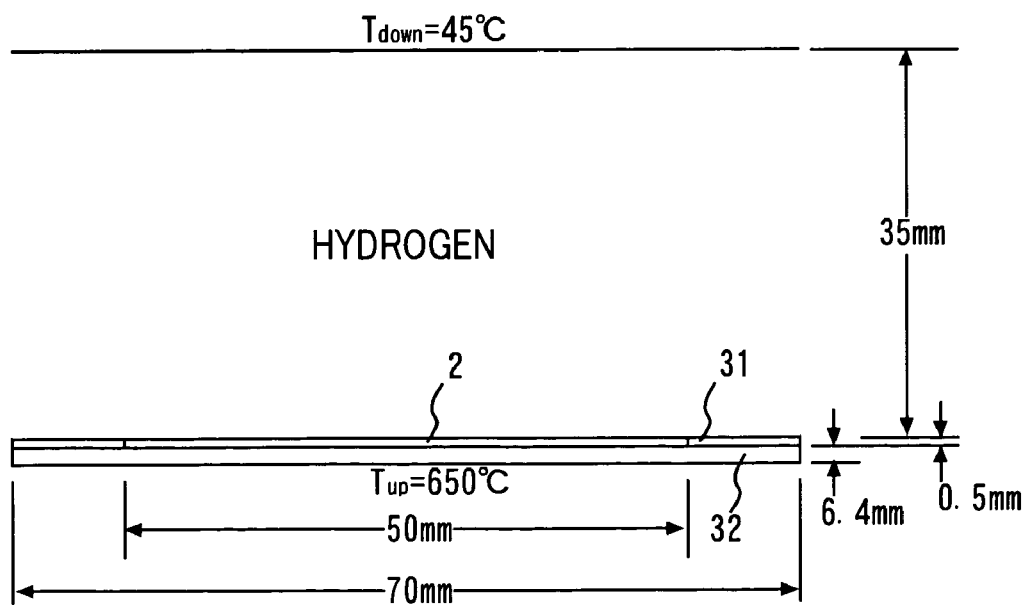
FIG. 4 is a schematic analytical model view showing a region around the wafer 2 and wafer holder 3 of the vapor-phase growth apparatus 100 according to the embodiment.

FIG. 4 is a schematic analytical model view showing a region around the wafer 2 and wafer holder 3 (having an outward width of 10 mm from the periphery of wafer) of the vapor-phase growth apparatus 100. As shown in FIG. 4, a distance from the bottom surface of the wafer holder 3 to the wafer 2 was defined as 6.4 mm. The wafer 2 was an InP wafer having a thickness of 0.5 mm and an inner diameter of 50 mm (2 inches), and the reaction furnace 1 was conditioned to have a hydrogen atmosphere. The number of meshes for the analysis was defined as about 6,000,000 meshes.

The contact heat resistance ($R_{1g}$) between the wafer 2 and the heat flow transmitting section 32, and the contact heat resistance ($R_{2g}$) between the heat flow control section 31 and the heat flow transmitting section 32 were defined as $2.0 \times 10^{-4}$ $m^2K/W$. It is to be noted that the contact heat resistance $R_{1g}$ is affected by the flatness, surface roughness and coefficient of thermal diffusion of the material, of the members contacting with each other, and it can further be reduced by reducing the distance between the contact surfaces.

The analytical conditions further includes boundary conditions of 45° C. for the boundary plane of hydrogen gas located 35 mm above the wafer 2, and of 650° C. for the boundary (rear surface) of the wafer holder 3.

In the heat transfer analysis of this model, hydrogen was approximately assumed as a solid, since hydrogen having a small Prandtl number shows thermal diffusion which prevails over viscous diffusion, and since effects of advection is negligible in a region having a relatively small Reynolds number in the laminar flow region.

The following physical property values were used for the present analysis.

TABLE 1

|  | HYDROGEN | GRAPHITE (COMPARATIVE EXAMPLE) | α-CARBON (EXAMPLE) | InP |
|---|---|---|---|---|
| DENSITY [kg/m$^3$] | 0.00259 | 2000 | 1550 | 4787 |
| SPECIFIC HEAT [J/kgK] | 14500 | 1000 | 1000 | 368 |
| COEFFICIENT OF THERMAL CONDUCTIVITY [W/m · K] | 0.4048 | 100 | 10 | 14.3 |

Figure 5:
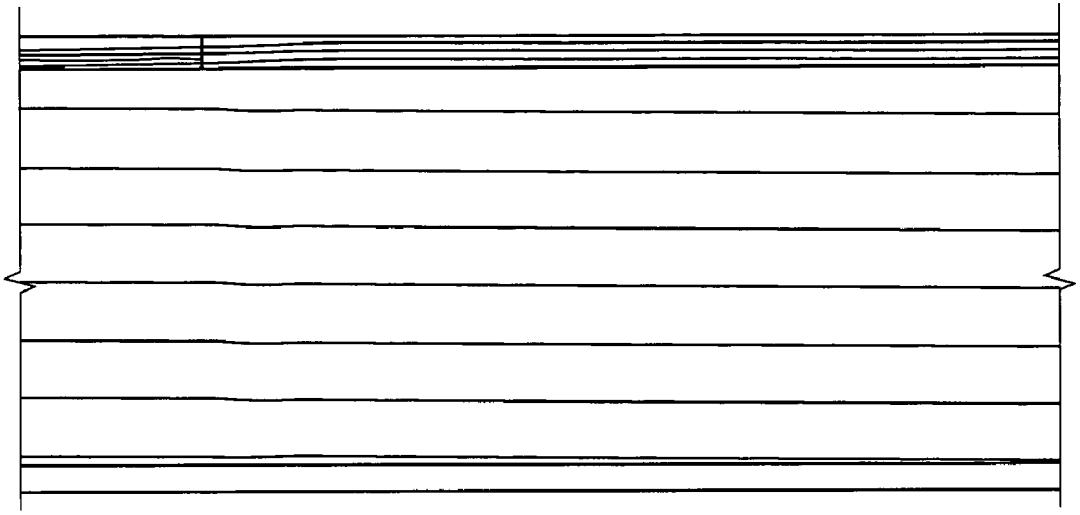
FIG. 5 shows an analytical result of temperature distribution inside the wafer and wafer holder in the embodiments wafer holder which is composed of a heat flow control section and a heat flow transmitting section is used.
Figure 6:
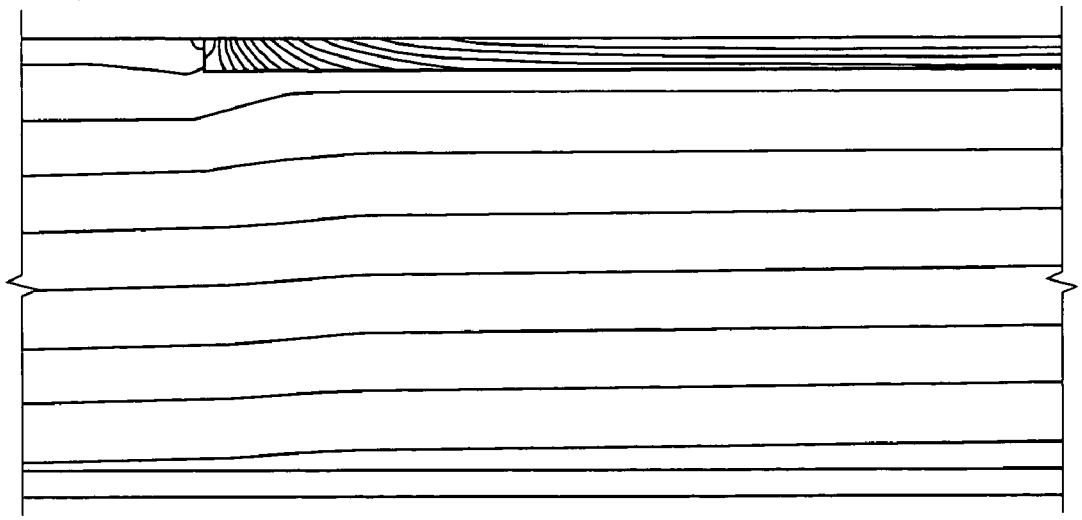
FIG. 6 shows an analytical result of temperature distribution inside the wafer and wafer holder in a comparative embodiment where a graphite-made wafer holder is used.

FIG. 5 shows an analytical result of temperature distribution within the wafer 2 and wafer holder 3 in an Example where a wafer holder 3 comprising a heat flow control section and-a heat flow transmitting section is used, and FIG. 6 shows an analytical result of temperature distribution within the wafer 2 and wafer holder 3 in a Comparative Example where an α-carbon-made wafer holder 3 is used. It is to be noted that FIGS. 5 and 6 show enlarged views of the boundary portion between the wafer 2 and wafer holder 3 in order to clarify the analytical results.

Figure 7:
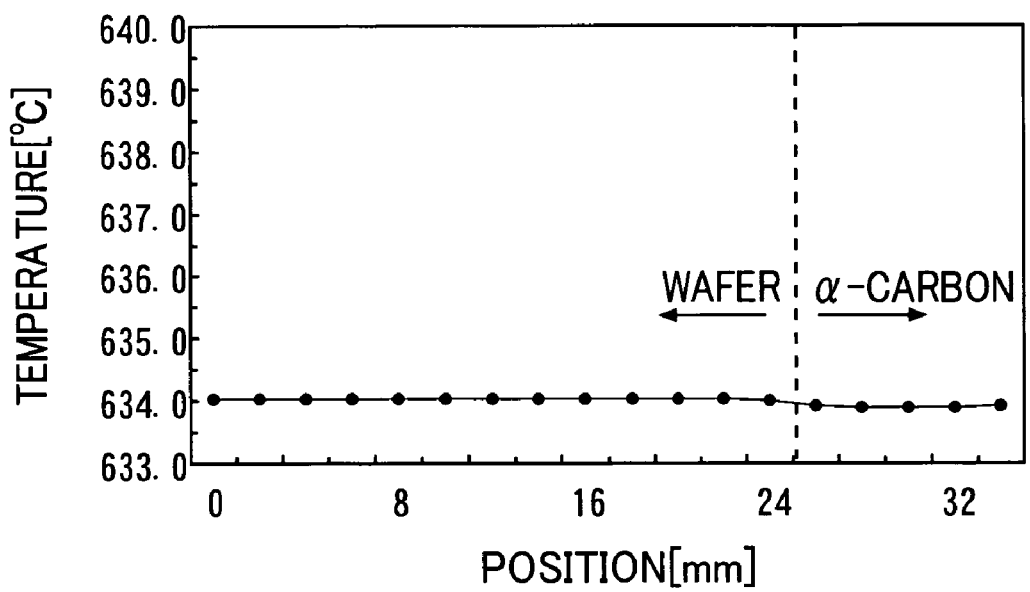
FIG. 7 shows analytical results of surface temperature distribution of the wafer 2 and wafer holder 3 in the embodiment.
Figure 8:
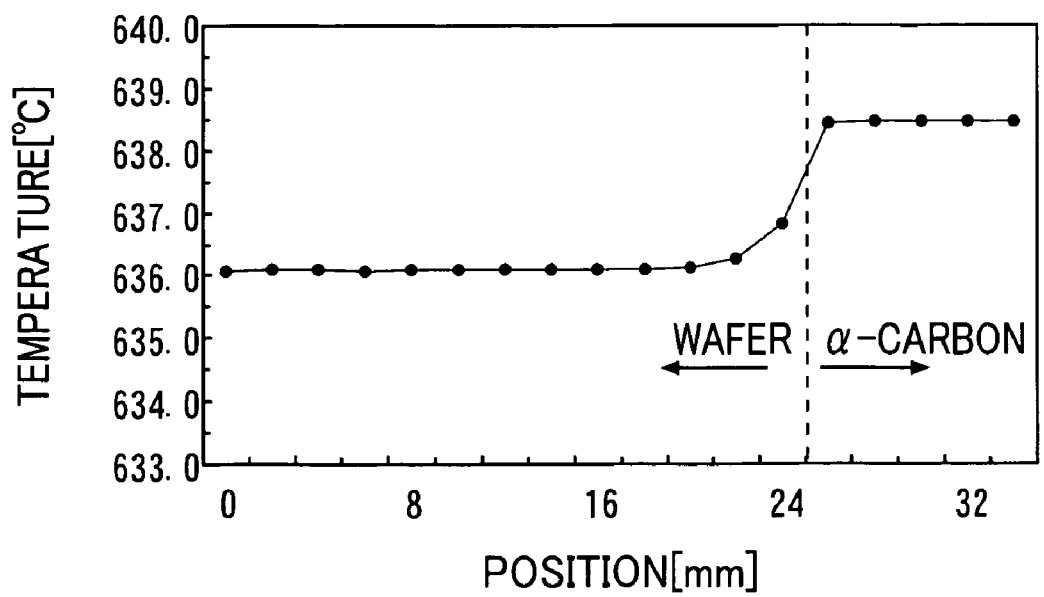
FIG. 8 shows analytical results of surface temperature distribution of the wafer and wafer holder in the comparative embodiment.
Figure 9:
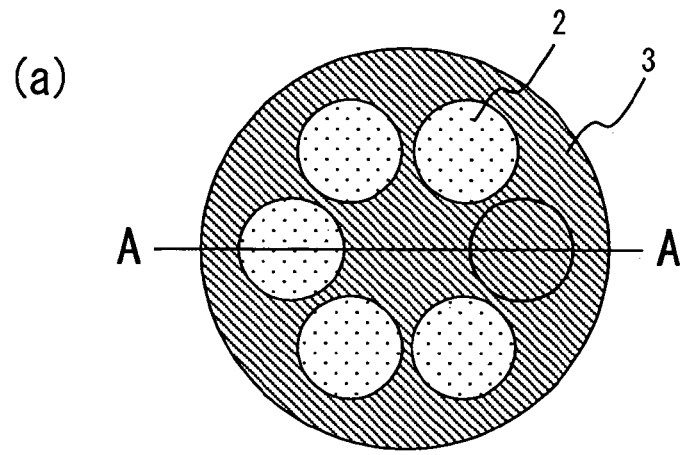
FIG. 9 is an enlarged views showing a detailed construction of an earlier developed wafer holder 3, where (a) is a plan view, and (b) is a sectional view taken along the line A-A.
Figure 10:
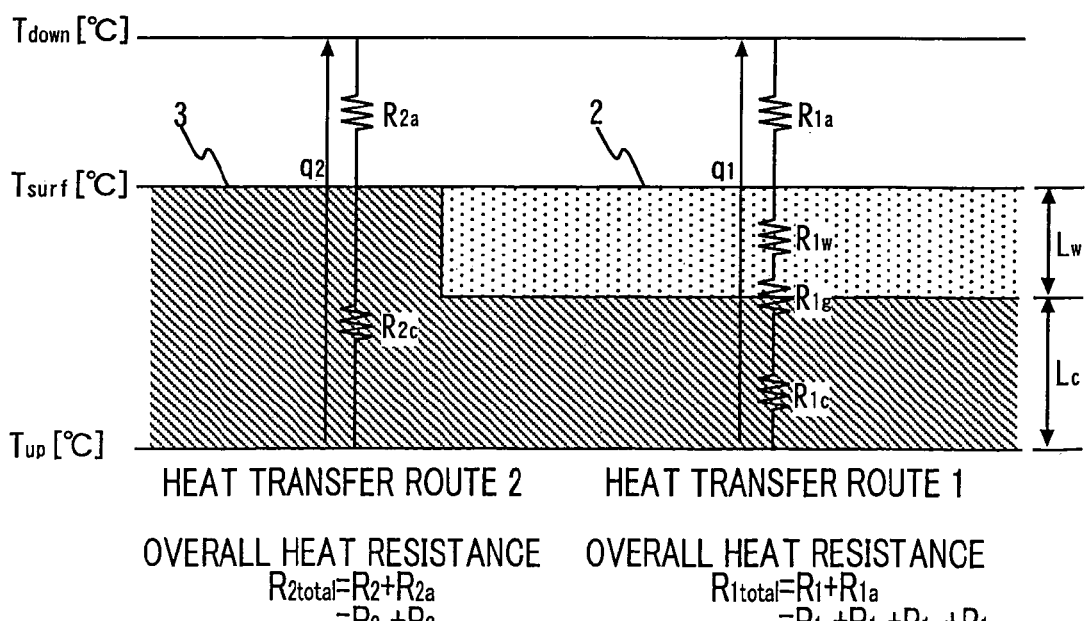
FIG. 10 is a schematic view for explaining heat resistance of the wafer 2 and wafer holder 3 in an earlier developed vapor-phase growth apparatus.

FIG. 7 shows analytical results of surface temperature distribution of the wafer 2 and wafer holder 3 in the Example, and FIG. 8 shows analytical results of surface temperature distribution of the wafer 2 and wafer holder 3 in the Comparative Example. It is to be noted that FIGS. 7 and 8 show the surface temperature measured at positions along the direction of diameter assuming the center of the wafer as zero.

In the Example, as shown in FIG. 5, the temperature gradients in the wafer 2 and the heat flow transmitting section 32 are almost equivalent, and a parallel and uniform isothermal lines distribution is observed in the wafer 2. On the other hand in Comparative Example, as shown in FIG. 6, the temperature gradients in the wafer 2 and the upper portion of the wafer holder 3 are quite different from each other. In the wafer 2, temperature increases toward the peripheral portion from the central portion. This indicates that, in Example, similar heat transfer is established even if the heat transfer route differs.

Heat resistance ratio $R_2/R_1$ was found to be 1.06 in Example, but 0.24 in Comparative Example.

It was also found for Example shown in FIG. 7 that each of the front surface temperatures of the wafer and of the wafer holder (heat flow control section) was the same at 634.0° C., whereas it was found for Comparative Example shown in FIG. 8 that the front surface temperature of the wafer was 636.0° C., and the front surface temperature of the wafer holder was 638.0° C. That is, the difference between them is about 2.0° C. It was thus made clear that the present Example showed a smaller difference in the front surface temperatures between the circumferential portion (22 to 25 mm) and the central portion (around 0) of the wafer 2, and that the in-plane temperature distribution of the wafer 2 was improved to attain uniformity.

As described above, Example was successful in keeping uniformity of the in-plane temperature distribution of the wafer 2 because the surface temperature in the circumferential portion of the wafer 2 became less likely to be affected by the surface temperature of the wafer holder 3. As a result, the present invention is successful in proceeding vapor-phase growth of a thin film which has a desirable uniformity over the entire surface of the wafer.

According to the present embodiment, because the vapor-phase growth apparatus 100 was designed so that the wafer container comprises: a heat flow control section having a space formed, for disposing a wafer therein; and a heat flow transmitting section which is joined to the heat flow control section, for transmitting heat to the wafer disposed in the space; and the contact heat resistance between the heat flow transmitting section and the heat flow control section is not less than $1.0 \times 10^{-6}$ m$^2$K/W and not more than $5.0 \times 10^{-3}$ m$^2$K/W , and the heat flow control section is made of a material having a coefficient of thermal conductivity which is not less than 0.5 times that of the wafer disposed on the heat flow transmitting section and not more than 20 times thereof. As a result, this almost equalizes the heat resistances for the individual heat transfer routes to each other during heat transfer from the rear surface of the wafer container (the rear surface of the heat flow transmitting section) to the front surfaces of the wafer and of the wafer container (the front surface of the heat flow control section).

That is, because heat transfer is performed according to almost equivalent heat flux, it is possible equalize achievable temperatures of the front surfaces of the wafer and of the wafer container. This successfully prevents the front surface temperature at the circumferential portion of the wafer from rising higher than the surface temperature at the center of the wafer which is caused by temperature difference between the surfaces of the wafer and the wafer container, and makes it possible to keep a uniform in-plane temperature distribution of the wafer. As a result, the present invention is successful in proceeding vapor-phase growth of a thin film which has a desirable uniformity over the entire surface of the wafer.

INDUSTRIAL APPLICABILITY

Although the foregoing paragraphs explained the present invention conceived by the present inventors mainly referring to a vertical high-speed-rotating-type, vapor-phase growth apparatus on which the background of the invention stands, the present invention is by no means limited to the above type, and instead applicable to any general vapor-phase growth apparatuses such as those based on face-down system, lateral type, autorotation/revolution system, and the like.

The present invention is applicable not only to the case where InP wafer is used, but also to cases where a thin film is grown on wafers such as being comprised of Si, GaAs, GaN, sapphire, glass, ceramic, and the like. In these cases, it is also allowable to alter a material composing the wafer holder 3 (or heat flow control section 31) depending on the wafer to be used.

The invention claimed is:

1. A vapor-phase growth apparatus comprising:
   a reaction furnace which is hermetically closable,
   a wafer container which is disposed in the reaction furnace, for disposing a wafer at a predetermined position,
   a gas supply member for supplying a source gas toward the wafer, and a heating member for heating the wafer,
wherein the apparatus is designed to form a grown film on a front surface of the wafer by supplying the source gas in a high temperature state while the heating member heats the wafer in the reaction furnace through the wafer container,
the wafer container comprises a heat flow control section having a space for disposing the wafer, and a heat flow transmitting section joined to the heat flow control section, for transmitting heat to the wafer disposed in the space,
the wafer is disposed on the heat flow transmitting section and disposed in the space of the heat flow control section,
a heat resistance $R_g$ at a flat or curved surface where the heat flow control section and the heat flow transmitting section are close to each other is uniform, and
a ratio $R_2/R_1$ is not less than 0.8 to not more than 1.2, where $R_1$ is a heat resistance for a heat transfer route from a rear surface of the heat flow transmitting section to the front surface of the wafer disposed on the heat flow transmitting section, and $R_2$ is a heat resistance for a heat transfer route from the rear surface of the heat flow transmitting section to a front surface of the heat flow control section.

2. The vapor-phase growth apparatus as claimed in claim 1, wherein the heat resistance $R_g$ is not less than $1.0 \times 10^{-6}$ m²K/W to not more than $5.0 \times 10^{-3}$ m²K/W.

3. The vapor-phase growth apparatus as claimed in claim 1, wherein a clearance distance between the heat flow control section and the heat flow transmitting section is uniform and the clearance is in a range of 0.001 mm to 1 mm.

4. The vapor-phase growth apparatus as claimed in claim 1, wherein the heat flow control section is made of a material having a coefficient of thermal conductivity which is not less than 0.5 times to not more than 20 times that of the wafer disposed on the heat flow transmitting section.

5. The vapor-phase growth apparatus as claimed as claimed in claim 1, wherein the heat flow transmitting section is made of a material having a coefficient of thermal conductivity which is not less than 50 W/mK to not more than 450 W/mK.

6. The vapor-phase growth apparatus as claimed in claim 1, wherein the heat flow control section is made of a material selected from a group consisting of amorphous carbon, aluminum nitride, graphite, silicon, silicon carbide, molybdenum, pyrolitec boron nitride, and alumina, and
the heat flow transmitting section is made of a material selected from a group consisting of molybdenum, graphite, gold, and silver.

7. A vapor-phase growth method comprising:
using a vapor-phase growth apparatus comprising a reaction furnace which is hermetically closable, a wafer container disposed in the reaction furnace, for disposing a wafer at a predetermined position, a gas supply member for supplying a source gas toward the wafer, and a heating member for heating the wafer, wherein the wafer container comprises a heat flow control section having a space for disposing, the wafer and a heat flow transmitting section joined to the heat flow control section for transmitting heat to the wafer disposed in the space;
disposing the wafer on the heat flow transmitting section and in the space of the heat flow control section; and
forming a thin film on a front surface of the wafer by supplying the source gas in a high temperature state while the heating member heats the wafer in the reaction furnace through the wafer container,
wherein a temperature difference between a front surface of the wafer container and a front surface of the wafer is within 2° C. in the forming, and
a ratio $R_2/R_1$ it is not less than 0.8 to not more than 1.2, where $R_1$ is a heat resistance for a heat transfer route from a rear surface of the heat flow transnmitting section to the front surface of the wafer disposed on the heat flow transmitting section, and $R_2$ is a beat resistance for a heat transfer route front the rear surface of the heat flow transmitting section to a front surface of the heat flow control section.

8. The vapor-phase growth method of claim 7, wherein a heat resistance $R_g$ at a flat or curved surface where the heat flow control section and the heat flow transmitting section are close to each other is uniform.

9. The vaper-phase growth method of claim 8, wherein the heat resistance $R_g$ is not less than $1.0 \times 10^{-6}$ m²K/W to not more than $5.0 \times 10^{-3}$ m²K/W.

10. The vapor-phase growth method of claim 9, wherein a clearance distance between the heat flow control section and the heat flow transnmitting section is uniform and the clearance is in a range of 0.001 mm to 1 mm.

11. The vapor-phase growth method of claim 7, wherein the gas supply member supplies a Group IIIB or a Group VB source gas and an inert gas.

12. The vapor-phase growth method of claim 11, wherein the Group IIIB gas is selected from the group consisting of trimethyl indium, trimethyl aluminum or trimethyl gallium.

13. The vapor-phase growth method of claim 11, wherein the Group VB gas is selected from the group consisting of arsine and phosphine.

14. The vapor-phase growth method of claim 11, wherein the inert gas is hydrogen.

15. The vapor-phase growth apparatus of claim 1, wherein the heat flow transmitting section is made of graphite and the heat flow control section is made of α-carbon.

16. The vapor-phase growth apparatus of claim 1, further comprising water-cooled jackets disposed on the lower outside wall of the reaction furnace.

* * * * *